United States Patent
Lee et al.

(10) Patent No.: US 10,090,386 B2
(45) Date of Patent: Oct. 2, 2018

(54) GRAPHENE-METAL BONDING STRUCTURE, METHOD OF MANUFACTURING THE SAME, AND SEMICONDUCTOR DEVICE HAVING THE GRAPHENE-METAL BONDING STRUCTURE

(71) Applicant: Samsung Electronics Co., Ltd., Suwon-Si, Gyeonggi-Do (KR)

(72) Inventors: Jaeho Lee, Seoul (KR); Hyeonjin Shin, Suwon-si (KR); Minhyun Lee, Yongin-si (KR); Changseok Lee, Siheung-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 645 days.

(21) Appl. No.: 14/533,802

(22) Filed: Nov. 5, 2014

(65) Prior Publication Data
US 2015/0364589 A1 Dec. 17, 2015

(30) Foreign Application Priority Data
Jun. 16, 2014 (KR) .................. 10-2014-0072972

(51) Int. Cl.
*H01L 29/15* (2006.01)
*H01L 31/0256* (2006.01)
(Continued)

(52) U.S. Cl.
CPC .... *H01L 29/1606* (2013.01); *H01L 21/28512* (2013.01); *H01L 23/485* (2013.01);
(Continued)

(58) Field of Classification Search
CPC .............. H01L 29/1606; H01L 23/485; H01L 21/28512; H01L 29/1037; H01L 29/45;
(Continued)

(56) References Cited

U.S. PATENT DOCUMENTS 8,253,124 B2   8/2012 Numata et al.
8,278,658 B2   10/2012 Okai et al.
(Continued)

FOREIGN PATENT DOCUMENTS

JP   2012028046 A   2/2012
KR  20120078639 A   7/2012
KR  20140010057 A   1/2014

OTHER PUBLICATIONS

Y. Matsuda, W. Deng, and W.A. Goddard III; "Contact Resistance for "End-Contacted" Metal-Graphene and Metal-Nanotube Interfaces from Quantum Mechanics"; J. Phys. Chem. C; 2010; vol. 114; pp. 17845-17850.*

(Continued)

*Primary Examiner* — William F Kraig
*Assistant Examiner* — Vicki B Booker
(74) *Attorney, Agent, or Firm* — Harness, Dickey & Pierce, P.L.C.

(57) ABSTRACT

Provided are a graphene-metal bonding structure, a method of manufacturing the graphene-metal bonding structure, and a semiconductor device including the graphene-metal bonding structure. According to example embodiments, a graphene-metal bonding structure includes: a graphene layer; a metal layer on the graphene layer; and an intermediate material layer between the graphene layer and the metal layer. The intermediate material layer forms an edge-contact with the metal layer from boundary portions of a material contained in the intermediate material layer that contact the metal layer.

19 Claims, 18 Drawing Sheets

(51) Int. Cl.
*H01L 29/16* (2006.01)
*H01L 29/78* (2006.01)
*H01L 29/45* (2006.01)
*H01L 29/778* (2006.01)
*H01L 29/10* (2006.01)
*H01L 29/165* (2006.01)
*H01L 21/285* (2006.01)
*H01L 23/485* (2006.01)
*H01L 29/417* (2006.01)

(52) U.S. Cl.
CPC ........ *H01L 29/1037* (2013.01); *H01L 29/165* (2013.01); *H01L 29/45* (2013.01); *H01L 29/456* (2013.01); *H01L 29/7781* (2013.01); *H01L 29/7839* (2013.01); *H01L 29/41725* (2013.01); *H01L 2924/0002* (2013.01)

(58) Field of Classification Search
CPC . H01L 29/456; H01L 29/7781; H01L 29/165; H01L 29/7839; H01L 2924/0002; H01L 2021/28543; H01L 29/41725
See application file for complete search history.

(56) References Cited

U.S. PATENT DOCUMENTS

| | | | |
|---|---|---|---|
| 8,471,237 | B2 | 6/2013 | Okai et al. |
| 8,481,421 | B2* | 7/2013 | Goddard ............... B82B 1/00 438/618 |
| 9,343,354 | B2* | 5/2016 | Lin .................... H01L 21/76814 |
| 9,461,134 | B1* | 10/2016 | Xie ......................... H01L 29/45 |
| 2011/0203831 | A1 | 8/2011 | Schmidt et al. |
| 2012/0199807 | A1 | 8/2012 | Goswami |
| 2012/0325305 | A1 | 12/2012 | Chandra et al. |
| 2013/0001516 | A1 | 1/2013 | Hebard et al. |
| 2013/0032794 | A1 | 2/2013 | Lee et al. |
| 2013/0134391 | A1 | 5/2013 | Afzali-Ardakani et al. |
| 2013/0248823 | A1 | 9/2013 | Bol et al. |
| 2013/0334498 | A1 | 12/2013 | Dimitrakopoulos et al. |
| 2013/0337620 | A1 | 12/2013 | Dimitrakopoulos et al. |
| 2014/0158989 | A1 | 6/2014 | Byun et al. |
| 2015/0123080 | A1* | 5/2015 | Yamaguchi ....... H01L 29/42368 257/29 |

OTHER PUBLICATIONS

Y. Matsuda,"Contact Resistance for "End-Contacted" Metal-Graphene and Metal-Nanotube Interfaces from Quantum Mechanics", J. Phys. Chem. C 2010, 114, 6pgs, Pasadena, California.
G. Giovannetti, "Doping Graphene with Metal Contacts", The American Physical Society, 2008, 4pgs, PRL 101, 026803, Nijmegen, The Netherlands.
M. Y. Han, "Energy Band-Gap Engineering of Graphene Nanoribbons", The American Physical Society, 2008, 4pgs, PRL 98, 206805, New York, USA.
B. Huard, "Evidence of the role of contacts on the observed electron-hole asymmetry in graphene", The American Physical Society, 2008, 4pgs, Physical Review B 78, 121402(R), Stanford, USA.
W. Leong, "Low-Contact-Resistance Graphene Devices with Nickel-Etched-Graphene Contacts", ACS Nano, 2014, 8 (1), 24pgs, American Chemical Society, Singapore.
A.M. Goossens, "Mechanical cleaning of graphene", Applied Physics Letters, 2011, 4pgs, vol. 100, Issue 7, Japan.
L. Wang, "One-Dimensional Electrical Contact to a Two-Dimensional Material", Science, 2013, 5 pgs, Science 342, 614, Washington, DC.
S. Ryu, "Raman Spectroscopy of Lithographically Patterned Graphene Nanoribbons", ACSNano, 2011, 8pgs, vol. 5, No. 5, New York, USA.
O. Balci, "Rapid thermal annealing of graphene-metal contact", AIP Applied Physics Letters, 2012, 6 pgs, Ankara, Turkey.
W. Li, "UV/Ozone treatment to reduce metal-graphene contact resistance", 2012, 17pgs, Cornell University Library, New York.
C. E. Malec, "Vacuum Annealed Cu contacts for graphene electronics", Elsevier, 2011, 8pgs, Atlanta, USA.
N. Lindvall, "Cleaning graphene using atomic force microscope", Journal of Applied Physics, 2012, 5pgs, American Institute of Physics, Moscow, Russian Federation.
J. Robinson,"Contacting graphene", Applied Physics Letters 98, 2011, 4pgs, American Institute of Physics, Pennsylvania, USA.
Y. Lin, "Graphene Annealing: How Clean Can It Be?", Nano Letters, American Chemical Society, 2012, 6pgs, ACS Publications, Tsukuba, Japan.
Nagashio, "Metal/Graphene Contact as a Performance Killer of Ultra-high Mobility Graphene—Analysis of Intrinsic Mobility and Contact Resistance-", IEEE, 2009, 4pgs, 23.2.1, Tokyo, Japan.
M. Choi, "Plasma treatments to improve metal contacts in graphene field effect transistor", Journal of Applied Physics, 2011, 7pgs, vol. 110, Issue 7, South Korea.
J. T. Smith, Reducing Contact Resistance in Graphene Devices through Contact Area Patterning, ACS Nano, 2013, 7pgs, vol. 7 No. 4, New York, USA.
J. Chan, "Reducing Extrinsic Performance-Limiting Factors in Graphene Grown by Chemical Vapor Deposition", ACS Nano, 2012, 6pgs, vol. 6 No. 4, Austin, USA.
C. Chen, "UV ozone treatment for improving contact resistance on graphene", Journal of Vacuum Science & Technology B, 2012, 4pgs, J. Vac. Sci. Technol. B, vol. 30, No. 6, Taiwan.
Khatami, et al. "Metal-to-Multilayer-Graphene Contact—Part II: Analysis of Contact Resistance," IEEE Transactions on Electron Devices, vol. 59, No. 9, pp. 2453-2460 (2012).

* cited by examiner

Comparative Example

GRAPHENE-METAL BONDING STRUCTURE, METHOD OF MANUFACTURING THE SAME, AND SEMICONDUCTOR DEVICE HAVING THE GRAPHENE-METAL BONDING STRUCTURE

RELATED APPLICATIONS

This application claims priority under 35 U.S.C. § 119 to Korean Patent Application No. 10-2014-0072972, filed on Jun. 16, 2014, in the Korean Intellectual Property Office, the disclosure of which is incorporated herein in its entirety by reference.

BACKGROUND

1. Field

The present disclosure relates to graphene-metal bonding structures, and more particularly, to graphene-metal bonding structures capable of reducing a contact resistance between graphene and metal, methods of fabricating the graphene-metal bonding structures, and/or semiconductor devices including the graphene-metal bonding structures.

2. Description of Related Art

Recently, research on applying graphene to various fields (e.g., nanoelectronics, optoelectronics, and chemical sensors) has been actively conducted. Graphene is a material having a structure in which carbon atoms are two-dimensionally connected to each other. Graphene is very thin. For example, the thickness of a graphene layer may be equal to that of a mono-atomic layer. Such graphene is generally used as a sheet. Graphene has an excellent electric mobility and thermal characteristics, which are superior to those of silicon. Graphene may be chemically stabilized and may have a large surface area. Graphene may be synthesized by using a chemical vapor deposition (CVD) method or may be obtained by peeling graphite layer by layer. However, if graphene is applied to a semiconductor device such as a transistor, the performance of the semiconductor device may be degraded as the contact resistance between graphene and metal increases.

SUMMARY

Provided are graphene-metal bonding structures, methods of fabricating the graphene-metal bonding structures, and/or semiconductor devices including the graphene-metal bonding structures.

Additional aspects will be set forth in part in the description which follows and, in part, will be apparent from the description, or may be learned by practice of example embodiments.

According to example embodiments, a graphene-metal bonding structure includes: a graphene layer; a metal layer on the graphene layer; and an intermediate material layer between the graphene layer and the metal layer. The intermediate material layer forms an edge-contact with the metal layer from boundary portions of a material contained in the intermediate material layer that contact the metal layer.

In example embodiments, the intermediate material layer may include a carbon-based material. The intermediate material layer may include at least one of a porous material having a plurality of pores, a crystalline material including a plurality of crystal grains, and a patterned graphene. The plurality of pores may be nano-sized and the plurality of crystal grains may be nano-sized.

In example embodiments, the porous material may be selectively reduced graphene oxide or a plurality of carbon nanotubes (CNTs), and the crystalline material may be nano-crystalline graphene including nano-sized crystal grains. The intermediate material layer may be patterned.

In example embodiments, intermediate material layer may have a multi-layer structure in which a plurality of material layers are stacked on each other. The plurality of material layers may include a material layer contacting the metal layer. The material layer contacting the metal layer may include at least one of a porous material having a plurality of pores, a crystalline material including a plurality of crystal grains, and a patterned graphene.

According to example embodiments, a method of manufacturing a graphene-metal bonding structure includes: forming a graphene layer on a substrate; forming an intermediate material layer on the graphene layer, the intermediate material layer including a carbon-based material on the graphene layer; and forming a metal layer on the intermediate material layer. The intermediate material layer forms an edge-contact with the metal layer from boundary portions of a material contained in the intermediate material layer that contacts the metal layer.

In example embodiments, the graphene layer and/or the intermediate material layer may be formed by a transfer method, a deposition method, a growth method, a dispersion coating method, or a spray coating method. The method may further include patterning the intermediate material layer after forming the intermediate material layer.

In example embodiments, the forming the intermediate material layer may include: forming at least one sheet of graphene on the graphene layer; and patterning the at least one sheet of graphene.

According to example embodiments, a semiconductor device includes: a first electrode and a second electrode spaced apart from each other on a substrate, the first and second electrodes including a metal; a gate insulating layer on the substrate between the first electrode and the second electrode; a gate electrode on the gate insulating layer; a first graphene layer between the substrate and the first electrode; a second graphene layer between the substrate and the second electrode; a first intermediate material layer between the first graphene layer and the first electrode, the first intermediate material layer forming an edge-contact with the first electrode from boundary portions of a material contained in the first intermediate material layer that contacts the first electrode; and a second intermediate material layer between the second graphene layer and the second electrode, the second intermediate material layer forming an edge-contact with the second electrode from boundary portions of a material contained in the second intermediate material layer that contacts the second electrode.

In example embodiments, the substrate may include a semiconductor material. The substrate may include a first region and a second region that are spaced apart from each other along a surface of the substrate. The first region and the second region may be doped with impurities. A channel may be between the first region and the second region. One of the first electrode and the second electrode may be a source electrode. An other of the first electrode and the second electrode may be a drain electrode.

According to example embodiments, a semiconductor device includes: an insulating layer on a substrate at one side of the substrate; a first electrode on the insulating layer, the first electrode including a metal; a second electrode on the substrate at an other side of the substrate, the second electrode including a metal; a first graphene layer between the insulating layer and the first electrode, the first graphene layer extending to a surface of the substrate; a second graphene layer between the substrate and the second electrode; a first intermediate material layer between the first electrode and the graphene layer, the first intermediate material layer forming an edge-contact with the first electrode from boundary portions that contact the first electrode; a second intermediate material layer between the second electrode and the second graphene layer, the second intermediate material layer forming an edge-contact with the second electrode boundary portions a material contained in the second intermediate material layer that contacts the second electrode; a gate insulating layer on the insulating layer and the substrate, the gate insulating layer covering the first graphene layer; and a gate electrode on the gate insulating layer.

In example embodiments, the substrate may include a semiconductor material. A channel may be formed on the surface of the substrate, and the second graphene layer may contact the channel. One side of the first graphene layer may contact the channel.

According to example embodiments, a graphene-metal bonding structure includes: a graphene layer; a metal layer on the graphene layer; and an intermediate material layer between the graphene layer and the metal layer. The intermediate material layer may be configured to reduce a contact resistance between the graphene layer and the metal layer compared to a contact resistance of a side. contact defined by a similar graphene layer directly contacting a similar metal layer.

In example embodiments, the intermediate material layer may include at least one of a porous material defining nano-sized pores, a crystalline material including nano-sized crystal grains, and a patterned graphene.

In example embodiments, the porous material may be selectively reduced graphene oxide or a plurality of carbon nanotubes (CNTs), and the crystalline material may be nano-crystalline graphene.

In example embodiments, the intermediate material layer may have a multi-layer structure in which a plurality of material layers may be stacked on each other.

In example embodiments, the graphene layer may be on a semiconductor substrate.

According to example embodiments, a semiconductor device includes: one of the above-described graphene-metal bonding structures on a substrate, the metal layer of the graphene-metal bonding structure being a first electrode, the graphene layer of the graphene-metal bonding structure being a first graphene layer between the substrate and the first electrode, and the intermediate material layer of the graphene-metal bonding structure being a first intermediate material layer; a second electrode spaced apart from the first electrode on the substrate, the first and second electrodes including a metal; a gate insulating layer on the substrate between the first electrode and the second electrode; a gate electrode on the gate insulating layer; a second graphene layer between the substrate and the second electrode; and a second intermediate material layer between the second graphene layer and the second electrode, the second intermediate material layer forming an edge-contact with the second electrode from boundary portions of a material contained in the second intermediate material layer that contact the second electrode.

According to example embodiments, a semiconductor device includes: an insulating layer on a substrate at one side of the substrate; one of the above-described graphene-metal bonding structures on the insulating layer, the metal layer of the graphene-metal bonding structure being a first electrode on the insulating layer, the first electrode including a metal, the graphene layer of the graphene-metal bonding structure being a first graphene layer between the insulating layer and the first electrode, the first graphene layer extending to a surface of the substrate, the intermediate material layer of the graphene-metal bonding structure being a first intermediate material layer between the first electrode and the first graphene layer; a second electrode on the substrate at an other side of the substrate, the second electrode including a metal; a second graphene layer between the substrate and the second electrode; a second intermediate material layer between the second electrode and the second graphene layer, the second intermediate material layer forming an edge-contact with the second electrode from boundary portions of a material contained in the second intermediate material layer that contact the second electrode; a gate insulating layer on the insulating layer and the substrate, the gate insulating layer covering the first graphene layer; and a gate electrode on the gate insulating layer.

BRIEF DESCRIPTION OF THE DRAWINGS

These and/or other aspects will become apparent and more readily appreciated from the following description of non-limiting example embodiments, taken in conjunction with the accompanying drawings in which like reference characters refer to like parts throughout the different views. The drawings are not necessarily to scale, emphasis instead being placed upon illustrating the principles of inventive concepts. In the drawings.

DETAILED DESCRIPTION

Figure 1:
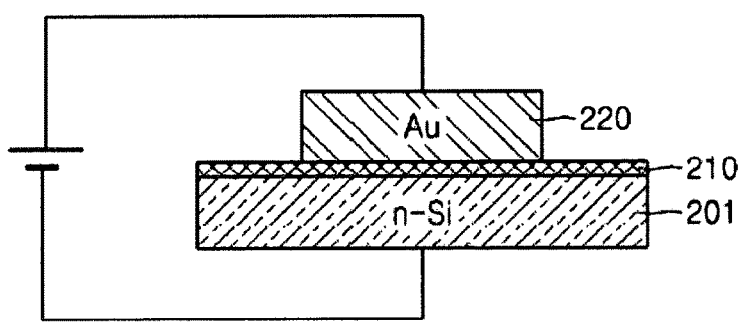
FIG. 1 is a diagram showing measurement of a contact resistance in a graphene-metal bonding structure, in which a graphene layer and a metal layer are side-by-side and in contact with each another.

Hereinafter, example embodiments will be described more fully with reference to the accompanying drawings, in which some example embodiments are shown Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, lengths and sizes of layers and regions may be exaggerated for clarity. Like reference characters and/or numerals in the drawings denote like elements, and thus their description may be omitted.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Other words used to describe the relationship between elements or layers should be interpreted in a like fashion (e.g., "between" versus "directly between," "adjacent" versus "directly adjacent," "connected" versus "directly connected"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Graphene may include an upper surface, a side surface (e.g., edge portion), and a lower surface. The upper surface of the graphene may be opposite the lower surface of the graphene. The side surface of the graphene may connect the upper surface to the lower surface of the graphene. In other words, if graphene has a length and a width that are greater than a thickness, then the side surface (e.g., edge portion) of the graphene may be defined by the thickness of the graphene and the upper surface and the lower surface of the graphene may be formed by the length and width of the graphene.

As used herein, 'side-contact' denotes a state in which an upper surface or a lower surface of graphene contacts a surface of the metal, where the thickness of the graphene is less than the length and/or width of the graphene. In a side-contact state, the upper surface or lower surface of the graphene may directly contact the surface of the metal.

As used herein, 'edge-contact' denotes a state in which a side surface (or edge portion) of the graphene contacts a surface of the metal. In a edge-contact state, the side surface (or edge) of the graphene may directly contact the surface of the metal.

In general, it is known that the graphene-metal bonding structure in which the graphene and the metal are in an edge-contact state has a contact resistance between the graphene and the metal that is much less than that of the graphene-metal bonding structure in which the graphene and the metal are in a side-contact state. Table 1 shows contact resistances between the graphene and the metal that contact each other by side and between the graphene and the metal that contact each other by edge, according to metal materials. The contact resistances shown Table 1 denote contact resistances between a carbon atom of the graphene and metal atom of the metal.

TABLE 1

|  | Ti | Pd | Pt | Cu | Au |
|---|---|---|---|---|---|
| "side-contact" Resistance (kΩ) | 938 | 8566 | 34689 | 630352 | 1261002 |
| "edge-contact" Resistance (kΩ) | 106.5 | 142.4 | 148.5 | 253.5 | 186.8 |

Referring to Table 1, the contact resistance between the edge-contact graphene and the metal is much less than that of the side-contact case.

In the graphene-metal bonding structure in which the graphene and the metal are in an edge-contact state, a bonding force between the graphene and the metal may be reduced. To improve the bonding force, a part of the graphene may be patterned and the metal may contact the patterned surface of the graphene. In this case, boundary portions are formed on the surface of the graphene due to the patterning, and the boundary portions contact the metal so as to substantially form an edge-contact between the patterned graphene and the metal.

FIG. 1 shows measurement of the contact resistance in a graphene-metal bonding structure in which a graphene layer 210 and a metal layer 220 are in a side-contact state. Referring to FIG. 1, the graphene layer 210 is disposed on an upper surface of a substrate 201, and the metal layer 220 is disposed on an upper surface of the graphene layer 210. Here, the substrate 201 is formed of n-Si, and the metal layer 220 is formed of Au.

Figure 2:
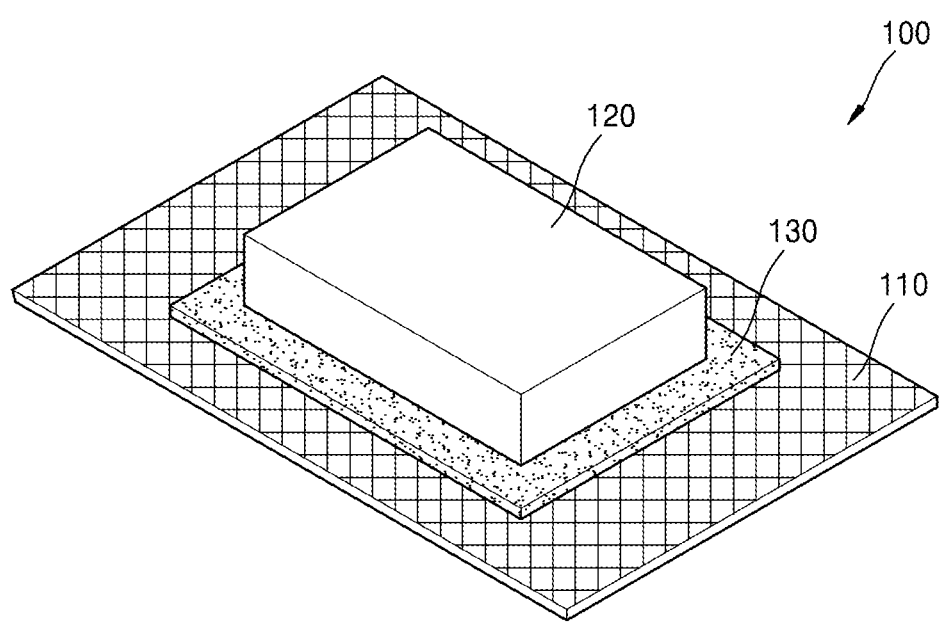
FIG. 2 is a diagram of a graphene-metal bonding structure according to example embodiments.
Figure 3:
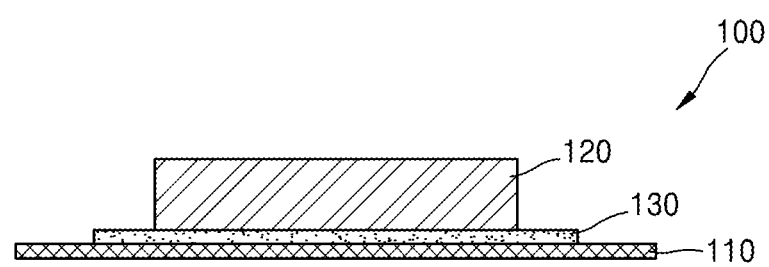
FIG. 3 is a cross-sectional view of the graphene-metal bonding structure of FIG. 2.

FIG. 2 is a diagram of a graphene-metal bonding structure 100 according to example embodiments, and FIG. 3 is a cross-sectional view of the graphene-metal bonding structure of FIG. 2.

Referring to FIGS. 2 and 3, the graphene-metal bonding structure 100 includes a graphene layer 110, an intermediate material layer 130 formed on the graphene layer 110, and a metal layer 120 formed on the intermediate material layer 130. The graphene layer 110 may have a single-layer structure including a sheet of graphene. However, example embodiments are not limited thereto, that is, the graphene layer 110 may have a multi-layer structure, in which a plurality of sheets of graphene are stacked. The metal layer 120 may include, for example, Au, Cu, and Pt; however, example embodiments are not limited thereto. For example, the metal layer 120 may include various metal materials.

The intermediate material layer 130 is disposed between the graphene layer 110 and the metal layer 120. The intermediate material layer 130 may include a carbon-based material. The intermediate material layer 130 is disposed to form an edge-contact with the metal layer 120. In particular, the intermediate material layer 130 is disposed so that boundary portions of the material contained therein may contact the metal layer 120 to form the edge-contact. To do this, the intermediate material layer 130 may include at least one selected from a porous material including a plurality of pores, a crystalline material including a plurality of crystal grains, and a patterned graphene.

If the intermediate material layer 130 is formed of a porous material including pores, then boundary portions between the pores and the material contact the metal layer 120 to form the edge-contact. Here, the pores included in the porous material may be nano-sized. For example, a diameter of the pores included in the porous material may be in a range of 1 nm to 1,000 nm and/or in a range of 10 nm to 1,000 nm; however, example embodiments are not limited thereto. The porous material may be, for example, selectively reduced graphene oxide or a plurality of carbon nanotubes (CNTs). However, example embodiments are not limited thereto.

If the intermediate material layer 130 includes a crystalline material having a plurality of crystal grains, then grain boundaries, that is, boundaries of the crystal grains, contact the metal layer 120 to form the edge-contact. Here, the crystal grains may be nano-sized. For example, a size of the crystal grains included in the crystalline material may be in a range of 1 nm to 1,000 nm and/or in a range of 10 nm to 1,000 nm; however, example embodiments are not limited thereto. The crystalline material may be nano-crystalline graphene including nano-sized crystal grains, but example embodiments are not limited thereto. If the intermediate material layer 130 includes the patterned graphene, there are boundary portions generated due to the patterning, and then, the boundary portions contact the metal layer 120 to form the edge-contact.

As described above, in a graphene-metal bonding structure 100 according to example embodiments, the intermediate material layer 130 for forming the edge-contact is disposed between the graphene layer 110 and the metal layer 120, and thus, the contact resistance between the graphene layer 110 and the metal layer 120 may be reduced greatly. That is, since both the intermediate material layer 130 and the graphene layer 110 are formed of carbon-based materials, the contact resistance between the graphene layer 110 and the intermediate material layer 130 may be not generated (and/or may be substantially less compared to a contact resistance between metal and graphene in a side-contact). Also, the contact resistance between the intermediate material layer 130 and the metal layer 120 may be greatly reduced due to the edge-contact. Therefore, if the graphene-metal bonding structure 100 according to example embodiments is applied to the semiconductor device such as a transistor, performances of the semiconductor device may be improved owing to the reduction in the contact resistance. In addition, the graphene-metal bonding structure 100 according to example embodiments may be applied to a small device such as a nano-device, as well as a large device.

Figure 4:
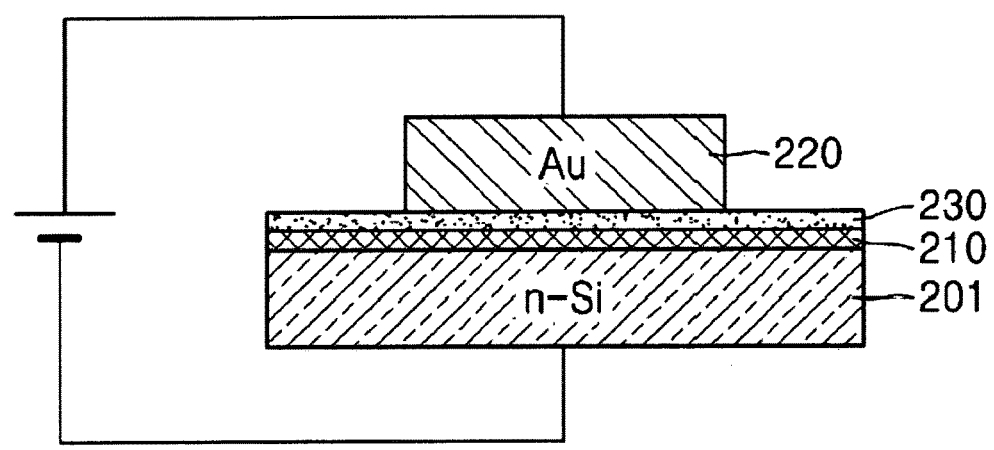
FIG. 4 is a diagram showing measurement of a contact resistance in graphene-metal bonding structure according to example embodiments.

FIG. 4 shows measurement of a contact resistance in a graphene-metal bonding structure according to example embodiments. Referring to FIG. 4, the graphene layer 210 is disposed on the upper surface of the substrate 201, an intermediate material layer 230 is disposed on the upper surface of the graphene layer 210, and the metal layer 220 is disposed on an upper surface of the intermediate material layer 230. Here, the substrate 201 is formed of n-Si, and the metal layer 220 is formed of Au. In addition, the intermediate material layer 230 is formed of nano-crystalline graphene including nano-sized crystal grains.

Figure 5:
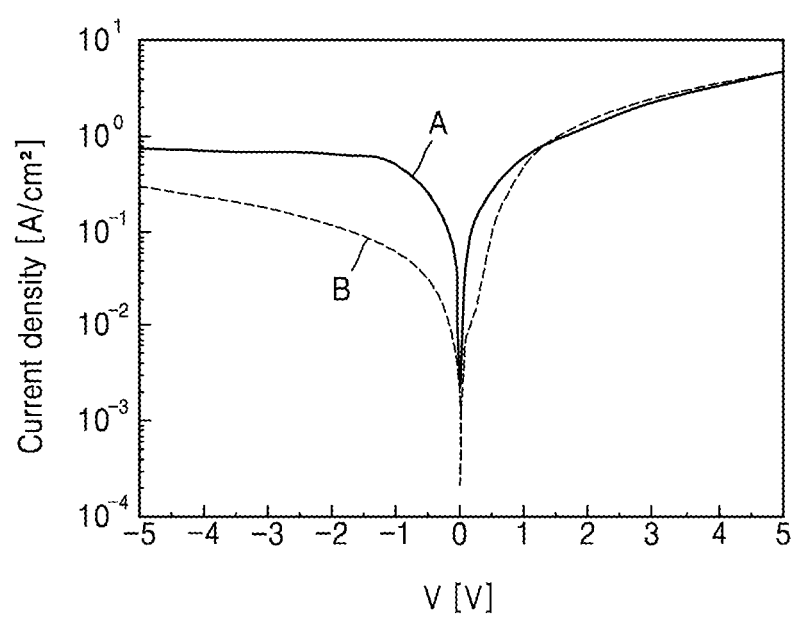
FIG. 5 is a graph of a measured current density of the graphene-metal bonding structure of FIG. 1 versus a current density measured from the graphene-metal bonding structure of FIG. 4.

FIG. 5 is a graph of a measured current density B of the graphene-metal bonding structure of FIG. 1 versus a measured current density A of the graphene-metal bonding structure shown in FIG. 4 according to example embodiments.

Referring to FIG. 5, the current density A of the graphene-metal bonding structure shown in FIG. 4 according to example embodiments is greater than the current density B of the graphene-metal bonding structure shown in FIG. 1. Therefore, the graphene-metal bonding structure of FIG. 4 according to example embodiments has reduced contact resistance between the graphene layer 210 and the metal layer 220 due to the intermediate material layer 230, when compared with the graphene-metal bonding structure shown in FIG. 1.

Figure 6:
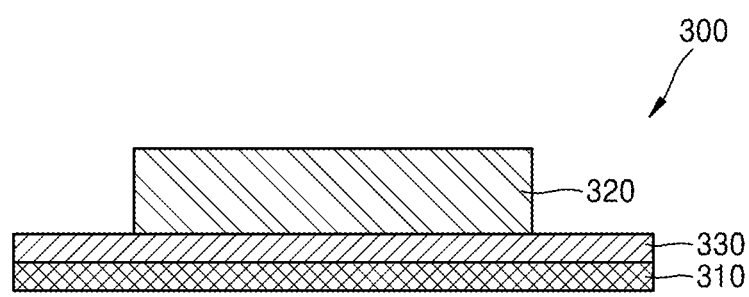
FIG. 6 is a diagram of a graphene-metal bonding structure according to example embodiments.

FIG. 6 is a diagram of a graphene-metal bonding structure 300 according to example embodiments.

Referring to FIG. 6, the graphene-metal bonding structure 300 includes a graphene layer 310, an intermediate material layer 330 that is patterned on the graphene layer 310, and a metal layer 320 disposed on the patterned intermediate layer 330. The graphene layer 310 may have a single-layer or a multi-layer structure.

The intermediate material layer 330 that is patterned is disposed between the graphene layer 310 and the metal layer 320. The patterned intermediate material layer 330 may include a carbon-based material, and is disposed to form an edge-contact with the metal layer 320. That is, the patterned intermediate material layer 330 is disposed so that boundary portions of component materials of the intermediate material layer 330 may contact the metal layer 320 in order to form the edge-contact with the metal layer 320. The patterned intermediate material layer 330 may include, for example, at least one of a porous material including a plurality of pores and a crystalline material including a plurality of crystal grains.

If the patterned intermediate material layer 330 is formed of a porous material including the pores, then boundary portions between the pores and the material, and boundary portions generated by the patterning contact the metal layer 320 to form the edge-contact. The porous material may include, for example selectively reduced graphene oxide or a plurality of CNTs. In addition, if the patterned intermediate material layer 330 includes a crystalline material having a plurality of crystal grains, grain boundaries (that is, boundaries of the crystal grains) and boundary portions generated by the patterning contact the metal layer 320 to form the edge-contact. The crystalline material may be nano-crystalline graphene including nano-sized crystal grains, but is not limited thereto.

As described above, the graphene-metal bonding structure 300 according to example embodiments may further include the boundary portions generated by the patterning, when compared with the graphene-metal bonding structure 100 of FIG. 2. Thus, the edge-contact with the metal layer 320 may be increased, and accordingly, the contact resistance between the graphene layer 310 and the metal layer 320 may be reduced increasingly.

Figure 7:
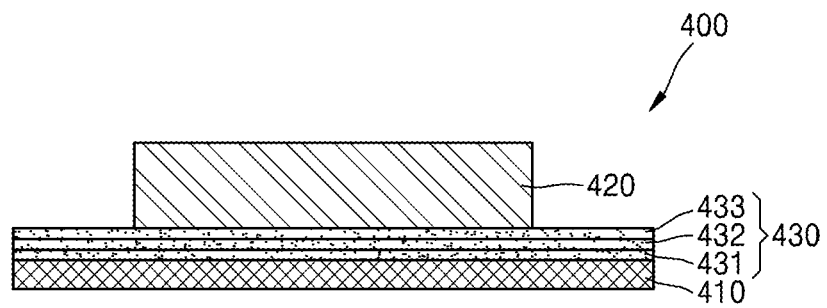
FIG. 7 is a diagram of a graphene-metal bonding structure according to example embodiments.

FIG. 7 is a diagram of a graphene-metal bonding structure 400 according to example embodiments.

Referring to FIG. 7, the graphene-metal bonding structure 400 may include a graphene layer 410, an intermediate material layer 420 disposed on the graphene layer 410, and a metal layer 420 disposed on the intermediate material layer 430. The graphene layer 410 may have a single-layer or a multi-layer structure. For example, a thickness of the graphene layer 410 may be one atomic layer or a plurality of atomic layers. A thickness of the graphene layer 410 may be in a range of two to four atomic layers, but example embodiments are not limited thereto. The intermediate material layer 430 is disposed between the graphene layer 410 and the metal layer 420.

In example embodiments, the intermediate material layer 430 has a multi-layer structure in which a plurality of material layers 431, 432, and 433 are stacked. In particular, the intermediate material layer 430 may include a first material layer 431, a second material layer 432, and a third material layer 433 sequentially stacked on the graphene layer 410. Here, the first, second, and third material layers 431, 432, and 433 may include a carbon-based material. The intermediate material layer 430 is disposed to form an edge-contact with the metal layer 420. That is, the third material layer 433 in the intermediate material layer 430, which contacts the metal layer 420, forms the edge-contact with the metal layer 420. To do this, the third material layer 433 may include, for example, at least one selected from a porous material including a plurality of pores, a crystalline material including a plurality of crystal grains, and graphene patterned in a desired (and/or alternatively predetermined) pattern.

If the third material layer 433 is formed of the porous material including a plurality of pores, boundary portions between the pores and the material contact the metal layer 420 to form the edge-contact. The porous material may include, for example, selectively reduced graphene oxide or a plurality of CNTs. In addition, if the third material layer 433 includes a crystalline material having a plurality of crystal grains, grain boundaries, that is, boundaries of the crystal grains, contact the metal layer 420 to form the edge-contact. The crystalline material may be nano-crystalline graphene including nano-sized crystal grains. In addition, if the third material layer 433 includes the patterned graphene, boundary portions generated due to the patterning may contact the metal layer 420 to form the edge-contact.

From among the plurality of material layers 431, 432, and 433, the first and second material layers 431 and 432 that do not contact the metal layer 420 may include various carbon-based materials. Here, the first and second material layers 431 and 432 may be formed of a material having boundary portions, for example, the porous material, the crystalline material, or the patterned graphene, or a material that does not have a boundary portion, for example, graphene that is not patterned. In the above description, a case in which the intermediate material layer 430 includes three material layers 431, 432, and 433 is described as an example; however, the intermediate material layer 430 may include two, four, or more material layers.

Figure 8:
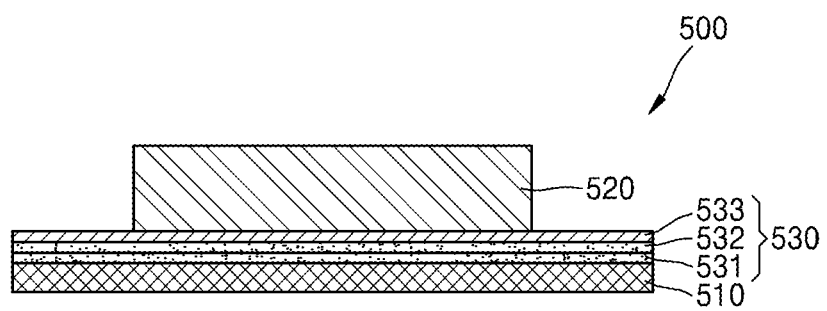
FIG. 8 is a diagram of a graphene-metal bonding structure according to example embodiments.

FIG. 8 is a diagram of a graphene-metal bonding structure 500 according to example embodiments.

Referring to FIG. 8, the graphene-metal bonding structure 500 includes a graphene layer 510, an intermediate Material layer 530 disposed on the graphene layer 510, and a metal layer 520 disposed on the intermediate material layer 530. The graphene layer 510 may have a single-layer or a multi-layer structure. For example, a thickness of the graphene layer 510 may be one atomic layer or a plurality of atomic layers. A thickness of the graphene layer 510 may be in a range of two to four atomic layers, but example embodiments are not limited thereto, and the thickness of the graphene layer 510 alternatively may be more than four atomic layers. The intermediate material layer is disposed between the graphene layer 510 and the metal layer 520.

The intermediate material layer 530 has a multi-layer structure, in which a plurality of material layers 531, 532, and 533 are stacked. In particular, the intermediate material layer 530 may include a first material layer 531 and a second material layer 532, and a patterned material layer 533 that are sequentially stacked on the graphene layer 510. Here, the first and second material layers 531 and 532, and the patterned material layer 533 may include carbon-based materials. In the intermediate material layer 530, the patterned material layer 533 contacting the metal layer 520 may form an edge-contact with the metal layer 520. That is, the patterned material layer 533 is disposed so that boundary portions generated due to the patterning may contact the metal layer 520 to form the edge-contact. The patterned material layer 533 may include, for example, at least one of a porous material including a plurality of pores and a crystalline material including a plurality of crystal grains.

If the patterned material layer 533 is formed of a porous material having the pores, boundary portions between the pores and the material, and boundary portions generated by the patterning contact the metal layer 520 to form the edge-contact. In addition, if the patterned material layer 533 includes a crystalline material having a plurality of crystal grains, grain boundaries (that is, boundaries of the crystal grains) and the boundary portions generated by the patterning contact the metal layer 520 to form the edge-contact.

From among the plurality of material layers 531, 532, and 533, the first and second material layers 531 and 532 that do not contact the metal layer 520 may include various carbon-based materials. Here, the first and second material layers 531 and 532 may be formed of a material having boundary portions, for example, a porous material, a crystalline material, or patterned graphene, or a material that does not include any boundary such as graphene that is not patterned. In the above description, a case in which the intermediate material layer 530 includes three material layers 531, 532, and 533 is described; however, example embodiments are not limited thereto, that is, the intermediate material layer 530 may include two, four or more material layers.

FIGS. 9 through 12 are diagrams illustrating a method of manufacturing a graphene-metal bonding structure, according to example embodiments.

Figure 9:
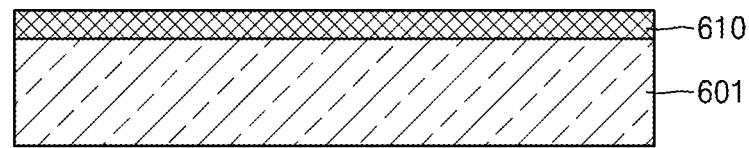
FIGS. 9 through 12 are diagrams illustrating a method of fabricating a graphene-metal bonding structure according to example embodiments.

Referring to FIG. 9, a graphene layer 610 is formed on a substrate 601. The graphene layer 610 may be formed by, for example, a transfer method, a deposition method, a growth method, a dispersion coating method, or a spray coating method. Here, the graphene layer 610 may have a single-layer structure including a sheet of graphene, or a multi-layer structure in which a plurality of sheets of graphene are stacked. If the graphene layer 610 is a single-layer structure, a thickness of the graphene layer 610 may be one atomic layer.

Figure 10:
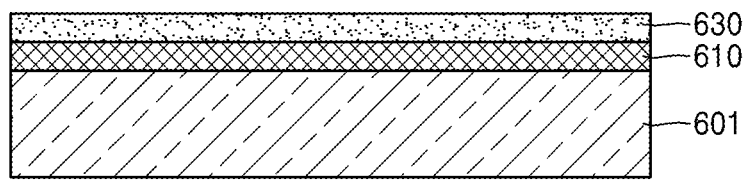

Referring to FIG. 10, an intermediate material layer 630 is formed on the graphene layer 610. The intermediate material layer 630 may include a carbon-based material. The intermediate material layer 630 forms edge-contact with the metal layer 620 formed thereon. That is, as will be described later, the intermediate material layer 630 is disposed so that boundary portions of a material contained in the intermediate material layer 630 may contact the metal layer 620 to form the edge-contact. To do this, the intermediate material layer 630 may include, for example, at least one selected from a porous material including a plurality of pores, a crystalline material including a plurality of crystal grains, and graphene pattered in a desired (and/or alternatively predetermined) pattern.

The pores included in the porous material may be nano-sized, but are not limited thereto. The porous material may include, for example, selectively reduced graphene oxide or CNTs. In addition, the crystal grains included in the crystalline material may be nano-sized; however, example embodiments are not limited thereto. The crystalline material may be nano-crystalline graphene including nano-sized crystal grains, but is not limited thereto. The intermediate material layer 630 may be formed by, for example, the transfer method, the deposition method, the growth method, the dispersion coating method, or the spray coating method. Here, the deposition method may include, for example, a chemical vapor deposition (CVD) method, but is not limited thereto.

Figure 11:
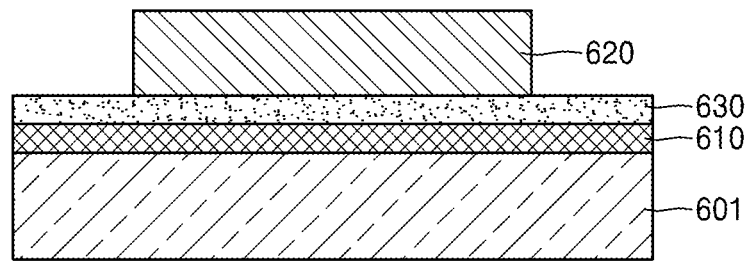

Referring to FIG. 11, when the metal layer 620 is formed on the intermediate material layer 630, the graphene-metal bonding structure is completed. The metal layer 620 may include, for example, Au, Cu, or Pt, but is not limited thereto, that is, may include other various metal materials. In the graphene-metal bonding structure fabricated as described above, the edge-contact is formed between the metal layer 620 and the intermediate material layer 630. That is boundary portions, such as boundaries between the pores and the material or boundaries between the crystal grains, on the upper surface of the intermediate material layer 630 contact the metal layer 620 disposed on the intermediate material layer 630 so as to form the edge-contact between the intermediate material layer 630 and the metal layer 620.

Figure 12:
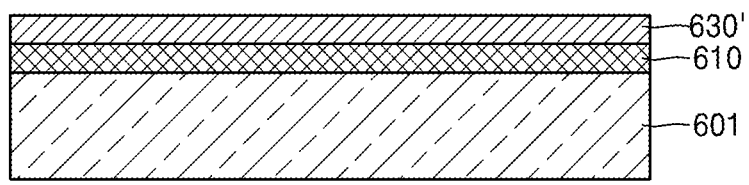

In addition, in a state where the intermediate material layer 630 is formed on the graphene layer 610 as shown in FIG. 10, a process of patterning the intermediate material layer 630 may be further performed as shown in FIG. 12.

Here, the patterning of the intermediate material layer 630 may be performed by, for example, a photolithography process and an etching process. In addition, when the metal layer 620 is formed on an upper surface of a patterned intermediate material layer 630', forming of the graphene-metal bonding structure may be finished. As described above, when the patterned intermediate material layer 630' is formed, boundary portions generated by the patterning process may be further formed, and thus, the contact resistance between the patterned intermediate material layer 630' and the metal layer 620 may be reduced increasingly.

In the above description, the intermediate material layer 630 has the single layer structure. However, the intermediate material layer 630 may have a multi-layer structure, in which a plurality of material layers are stacked, as described above. In this case, a material layer contacting the metal layer 620 may be formed of at least one selected from a porous material, a crystalline material, and patterned graphene. In addition, the intermediate material layer 630 may have a multi-layer structure in which a plurality of material layers are stacked, and a material layer contacting the metal layer 620 may be a patterned material layer.

FIGS. 13 through 16 are diagrams illustrating a method of manufacturing a graphene-metal bonding structure, according to example embodiments.

Figure 13:
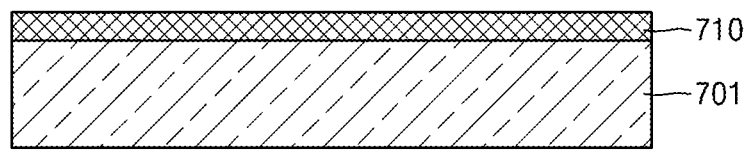
FIGS. 13 through 16 are diagrams illustrating a method of fabricating a graphene-metal bonding structure according to example embodiments.

Referring to FIG. 13, a first graphene layer 710 is formed on a substrate 701. The first graphene layer 710 may be formed by, for example, a transfer method, a deposition method, a growth method, a dispersion coating method, or a spray coating method. Here, the first graphene layer 710 may have a single-layer structure including a sheet of graphene or a multi-layer structure in which a plurality of sheets of graphene are stacked.

Figure 14:
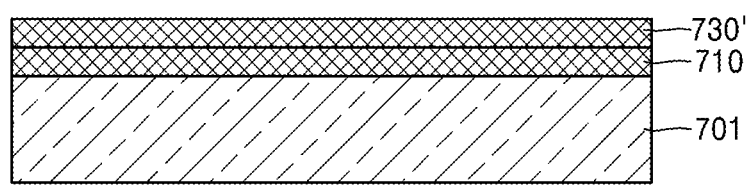

Referring to FIG. 14, a second graphene layer 730' is formed on the first graphene layer 710. The second graphene layer 730' includes at least a sheet of graphene. That is, the second graphene layer 730' may have a single-layer structure including a sheet of graphene or a multi-layer structure in which a plurality of sheets of graphene are stacked.

Figure 15:
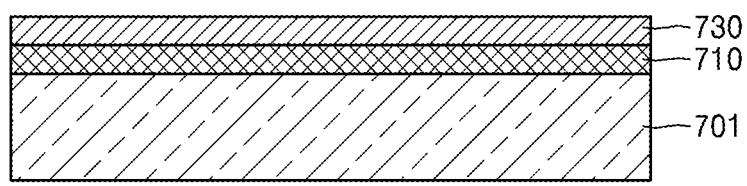

Referring to FIG. 15, the second graphene layer 730' is patterned to form an intermediate material layer 730. Here, if the second graphene layer 730' is formed of one sheet of graphene, the intermediate material layer 730 may be formed by patterning the one sheet of graphene in a desired (and/or alternatively predetermined) pattern. In addition, if the second graphene layer 730' includes a plurality of sheets of graphene, the intermediate material layer 730 may be formed by patterning at least one sheet of graphene including an uppermost sheet of graphene. The second graphene layer 730' may be patterned by using, for example, a photolithography process and an etching process. As described above, when the intermediate material layer 730 is formed by patterning the second graphene layer 730', there are boundary portions caused by the patterning in an upper surface of the intermediate material layer 730.

Figure 16:
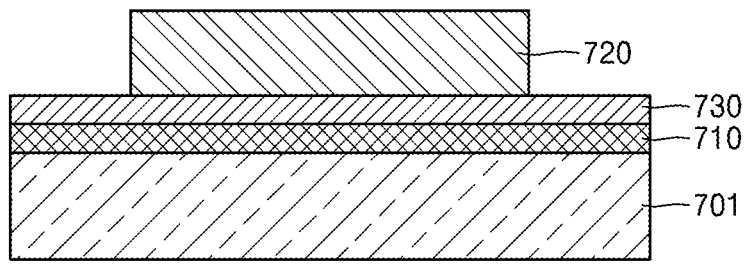

Referring to FIG. 16, a metal layer 720 is formed on the intermediate material layer 730 to finish forming of the graphene-metal bonding structure. Here, the edge-contact is formed between the metal layer 720 and the intermediate material layer 730 including the patterned graphene, as described above. That is there are the boundary portions generated due to the patterning of the graphene in the upper surface of the intermediate material layer 730, and the boundary portion contacts the metal layer 720 to form the edge-contact between the intermediate material layer 730 and the metal layer 720.

Figure 17:
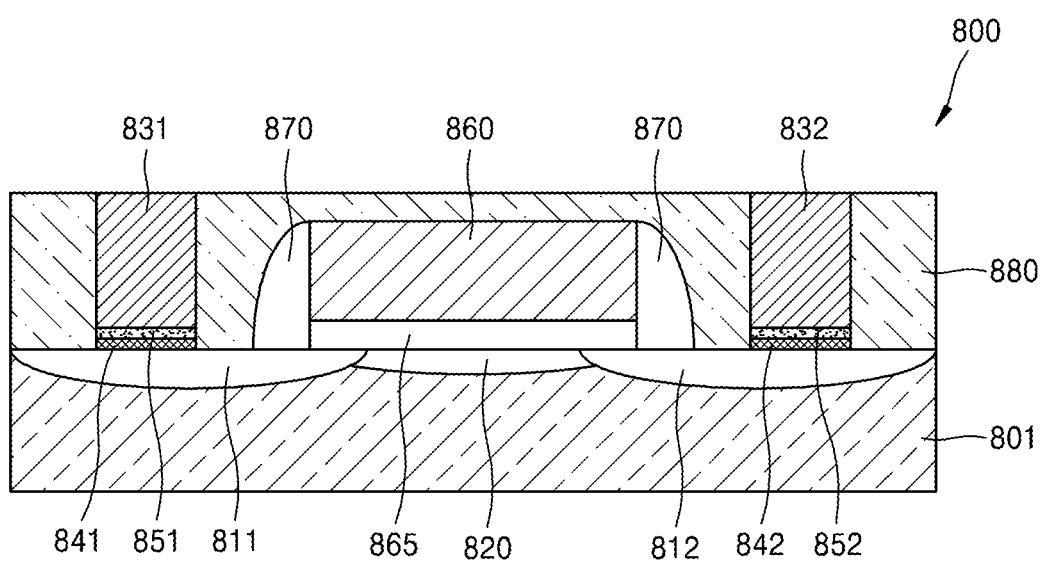
FIG. 17 is a diagram of a semiconductor device according to example embodiments.

FIG. 17 is a diagram of a semiconductor device 800 according to example embodiments. FIG. 17 shows a transistor as an example of the semiconductor device 800.

Referring to FIG. 17, a first electrode 831 and a second electrode 832 are formed at two sides of a substrate 801. A gate electrode 860 is formed on the substrate 801 between the first and second electrodes 831 and 832. The substrate 801 may include at least one semiconductor. For example, the substrate 801 may be formed of silicon (Si), but is not limited thereto. In addition, the substrate 801 may be doped as p-type or n-type. A first region 811 may be formed at one side on the substrate 801, and a second region 812 may be formed at another side on the substrate 801. Here, the first and second regions 811 and 812 may be doped with impurities to high concentrations. An impurity concentration in the first and second regions 811 and 812 may be higher than an impurity concentration in the substrate 801. The first and second regions 811 and 812 may be a source region and a drain region, respectively, or vice versa. In addition, a channel 820 may be formed on the upper surface of the substrate 801 between the first and second regions 811 and 812. The channel 820 may be part of the substrate 801. The semiconductor device 800 may be configured to form the channel 820 if a gate voltage is applied to the gate electrode 860 and the gate voltage is greater than or equal to a threshold voltage of the semiconductor device 800.

The first electrode 831 is formed on the first region 811 of the substrate 801, and the second electrode 832 is formed on the second region 812 of the substrate 801. The first and second electrodes 831 and 832 may be a source electrode and a drain electrode, respectively, or vice versa. The first and second electrodes 831 and 832 may be formed of metal having excellent conductivity. For example, the first and second electrodes 831 and 832 may include, Au, Cu, or Pt, but are not limited to the materials and may include other various metal materials. A first graphene layer 841 is formed between the first electrode 831 and the first region 811 of the substrate 801, and a second graphene layer 842 is formed between the second electrode 832 and the second region 812 of the substrate 801. Here, the first and second graphene layers 841 and 842 may each have a single-layer structure including one sheet of graphene or a multi-layer structure in which a plurality of sheets of graphene are stacked.

A first intermediate material layer 851 is disposed between the first graphene layer 841 and the first electrode 831, and a second intermediate material layer 852 is disposed between the second graphene layer 842 and the second electrode 832. Here, the first and second intermediate material layers 851 and 852 may be formed of the same material as any one of the intermediate material layers 130, 230, 330, 430, 530, 630, 630', and 730 in FIGS. 2-3, 4, 6-8, 10-12, and 15-16. That is, the first and second intermediate material layers 851 and 852 form edge-contacts with the first and second electrodes 831 and 832 that are formed of meta so as to reduce a contact resistance between the first electrode 831 and the first graphene layer 841 and a contact resistance between the second electrode 832 and the second graphene layer 842.

The first and second intermediate material layers 851 and 852 may include a carbon-based material. The first intermediate material layer 851 is disposed so that the boundary portions of the contained material may contact the first electrode 831 in order to form the edge-contact, and the second intermediate material layer 852 is disposed so that the boundary portions of the contained material may contact the second electrode 832 in order to form the edge-contact. To do this, each of the first and second intermediate material layers 851 and 852 may include, for example, at least one selected from a porous material including a plurality of pores, a crystalline material including a plurality of crystal grains, and graphene patterned in a desired (and/or alternatively predetermined) pattern. The first intermediate material layer 851 and second intermediate material layer 852 may be the same or different, in terms of a material and/or structure. If the first intermediate material layer 851 and the second intermediate material layer 852 have a difference in terms of a material, then the first intermediate material layer 851 may include at least one of a porous material including a plurality of pores, a crystalline material including a plurality of crystal grains, and graphene patterned in a desired (and/or alternatively predetermined) pattern, and the second intermediate material layer 852 may include a different at least one of a porous material including a plurality of pores, a crystalline material including a plurality of crystal grains, and graphene patterned in a desired (and/or alternatively predetermined) pattern.

The porous material may include, for example, selectively reduced graphene oxide or a plurality of CNTs. In addition, the crystalline material may be nano-crystalline graphene including nano-sized crystal grains, but is not limited thereto. Furthermore, the first and second intermediate material layers 851 and 852 may be patterned in order to improve characteristics of the device increasingly.

The first and second intermediate material layers 851 and 852 each may have a multi-layer structure in which a plurality of material layers are stacked. In this case, from among the plurality of material layers, a material layer contacting the first or second electrode 831 or 832 is a material including the boundary portions of the material contained in the material layer, and may include, for example, at least one selected from the porous material, the crystalline material, and the graphene patterned in a desired (and/or alternatively predetermined) pattern. In addition, from among the plurality of material layers, other material layers that do not contact the first or second electrode 831 or 832 may include various carbon-based materials. Here, other material layers that do not contact the first or second electrode 831 or 832 may be formed of a material including boundary portions, for example, the porous material, the crystalline material, or patterned graphene, or a material not including a boundary portion, for example, graphene that is not patterned. Furthermore, from among the plurality of material layers, the material layer contacting the first or second electrode 831 or 832 may be patterned to improve characteristics of the device increasingly.

A channel 820 is formed on an upper surface of the substrate 801 between the first and second regions 811 and 812. In addition, a gate insulating layer 865 and a gate electrode 860 are sequentially disposed on the channel 820 of the substrate 801. The gate insulating layer 865 may include a dielectric material. For example, the gate insulating layer 865 may include silicon oxide or silicon nitride. The gate electrode 860 may include metal that is highly conductive. For example, the gate electrode 860 may include, Au, Cu, or Pt, but are not limited to the materials and may include other various metal materials. Also, a spacer 870 may be further disposed on the substrate 801 around the gate electrode 860 and the gate insulating layer 865. The spacer 870 protects side surfaces of the gate electrode 860, and may adjust doping on the first and second regions 811 and 812. The spacer 870 may include, for example, silicon nitride. In addition, an insulating layer 880 may be further formed on the substrate 801 so as to cover the gate electrode 860 and the spacer 870.

In general, when bonding dissimilar materials, a band structure is formed based on Fermi levels. In a case of bonding between metal and semiconductor, because a work function of the metal and an electron affinity of the semiconductor are different from each other, a barrier is generated at an interface therebetween due to an energy difference, and accordingly, generating resistance. Such resistance is referred to as a contact resistance generated due to Schottky barrier. Meanwhile, in order to reduce the contact resistance caused by the Schottky barrier, metal having a work function that is similar to the electron affinity of the semiconductor may be used. However, in this case, a Fermi level pinning phenomenon may occur.

Generally a method of reducing a depletion region by doping the semiconductor or a method of inserting an intermediate material that rarely causes pinning between the metal and the semiconductor may be used in order to reduce the contact resistance caused by the Schottky barrier. The former is generally used in a field of source/drain junction in a semiconductor device; however, may not realize an ohmic contact completely. In addition, in the latter, a current amount may be reduced because the electric current has to pass through the intermediate material inserted between the metal and the semiconductor. To address the reduced current amount, a material that does not cause the pinning effect and has a thickness as thin as possible may be used as the intermediate material inserted between the metal and the semiconductor. Graphene is very small in thickness and may be doped, and does not cause the pinning effect. Thus, graphene has been considered as an ideal material that may be applied to the semiconductor device.

In the semiconductor device 800 of FIG. 17, the first graphene layer 841 is disposed between the first electrode 831 and the substrate 801, and the second graphene layer 842 and the second electrode 832 and the substrate 801 so as to reduce the contact resistance between the metal and the semiconductor due to the Schottky barrier. Meanwhile, when the first and second electrodes 831 and 832 are disposed to contact the first and second graphene layers 841 and 842 respectively, the contact resistance between the first and second electrodes 831 and 832 and the first and second graphene layers 841 and 842 increases due to side-contact between the graphene and the metal. In example embodiments, to limit and/or prevent the increase in the contact resistances between the first and second electrodes 831 and 832 and the first and second graphene layers 841 and 842, the first intermediate material layer 851 is disposed between the first electrode 831 and the first graphene layer 841 and the second intermediate material layer 852 disposed between the second electrode 832 and the second graphene layer 842.

The first and second intermediate material layers 851 and 852 include boundary portions of the materials contained therein, and the boundary portions contact the first and second electrodes 831 and 832 formed of metal to form the edge-contact. Thus, the contact resistances between the first and second electrodes 831 and 832 and the first and second graphene layers 841 and 842 may be greatly reduced.

While the semiconductor device 800 in FIG. 17 includes both a first intermediate material layer 851 and a second intermediate material layer 852, the first intermediate material layer 851 or the second intermediate material layer 852 may be omitted in an alternative semiconductor device.

Figure 18:
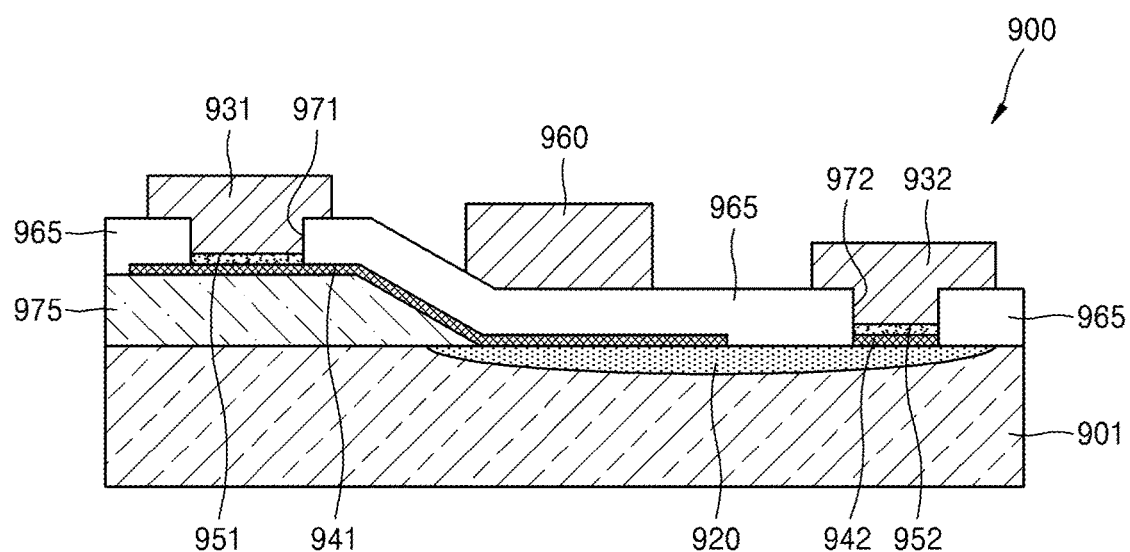
FIG. 18 is a diagram of a semiconductor device according to example embodiments.

FIG. 18 is a cross-sectional view of a semiconductor device 900 according to example embodiments. A transistor is shown as an example of the semiconductor device in FIG. 18.

Referring to FIG. 18, an insulating layer 975 is disposed on one side of the upper surface of a substrate 901 to a desired (and/or alternatively predetermined) height. The substrate 901 may include at least one semiconductor. For example the substrate 901 may be formed of silicon, but is not limited thereto. In addition, the substrate 901 may be doped to a p-type or an n-type. The insulating layer 975 may be formed of an insulating material. For example, the insulating layer 975 may include silicon oxide or silicon nitride, but is not limited thereto. In addition, a channel 920 is formed on the upper surface of the substrate 901.

A first graphene layer 941 is disposed on the insulating layer 875. Here the first graphene layer 941 extends to the upper surface of the substrate 901 and one side of the first graphene layer 941 may contact the channel 920. The first graphene layer 941 may have a single-layer structure including a sheet of graphene or a multi-layer structure in which a plurality of sheets of graphene are stacked. In addition, a second graphene layer 942 is disposed on another side of the upper surface of the substrate 901. Here, the second graphene layer 942 is separated a desired (and/or alternatively predetermined) distance from the first graphene layer 941 and contacts the channel 920.

A gate insulating layer 965 is disposed on the insulating layer 975 and the substrate 901 so as to cover the first graphene layer 941, and a gate electrode 960 is disposed on the gate insulating layer 965. Here, the gate electrode 960 is disposed at a location corresponding to the channel 920. A Schottky barrier is formed between the first graphene layer 941 and the channel 920 contacting each other, and a height of the Schottky barrier may be controlled by a voltage applied to the gate electrode 960. The gate electrode 960 may include a metal such as Au, Cu, or Pt, but is not limited to these materials and may include various other metal materials.

A first contact hole 971 and a second contact hole 972 are formed in the gate insulating layer 965. The first graphene layer 941 and a first electrode 931 are electrically connected to each other via the first contact hole 971, and the second graphene layer 942 and a second electrode 932 are electrically connected to each other via the second contact hole 972. A first intermediate material layer 951 is disposed between the first graphene layer 941 and the first electrode 931 located on the insulating layer 975. The first intermediate material layer 951 forms an edge-contact with the first electrode 931 so as to reduce a contact resistance between the first graphene layer 941 and the first electrode 931.

The second graphene layer 942 may reduce the contact resistance caused by the Schottky barrier that is generated when bonding the metal and the semiconductor to each other, as described above. If the second electrode 932 directly contacts the second graphene layer 942, the contact resistance between the second electrode 932 and the second graphene layer 942 increases due to side-contact between the graphene and metal. In order to reduce the contact resistance between the second electrode 932 and the second graphene layer 942, a second intermediate layer 952 may be disposed between the second electrode 932 and the second graphene layer 942.

The first and second intermediate material layers 951 and 952 may be formed of the same material as the intermediate material layers 851 and 852 described in FIG. 17. For example the first and second intermediate material layers 951 and 952 may be formed of the same material as any one of the intermediate material layers 130, 230, 330, 430, 530, 630, 630', and 730 in FIGS. 2-3, 4, 6-8, 10-12, and 15-16. For example, the first and second intermediate material layers 951 and 952 may include carbon-based materials, and boundary portions of the contained materials may contact the first and second electrodes 931 and 932 to form the edge-contact. To do this, the first and second intermediate material layers 951 and 952 may include a porous material having a plurality of pores, a crystalline material including a plurality of crystal grains, and graphene patterned in a desired (and/or alternatively predetermined) pattern. In addition, the first and second intermediate material layers 951 and 952 may be patterned to improve characteristics of the semiconductor device increasingly. The first intermediate material layer 951 and second intermediate material layer 952 may be the same or different, in terms of a material and/or structure. If the first intermediate material layer 951 and the second intermediate material layer 952 have a difference in terms of a material, then the first intermediate material layer 951 may include at least one of a porous material including a plurality of pores, a crystalline material including a plurality of crystal grains, and graphene patterned in a desired (and/or alternatively predetermined) pattern, and the second intermediate material layer 952 may include a different at least one of a porous material including a plurality of pores, a crystalline material including a plurality of crystal grains, and graphene patterned in a desired (and/or alternatively predetermined) pattern.

The first and second intermediate material layers 951 and 952 may have multi-layer structures, in which a plurality of material layers are stacked. In this case, from among the plurality of material layers, the material layer contacting the first or second electrode 931 or 932 may be formed of a material including boundary portions. In addition, from among the plurality of material layers, other material layers that do not contact the first or second electrode 931 or 932 may be formed of a material including the boundary portions or without a boundary portion. In addition, the material layer contacting the first or second electrode 931 or 932 may be patterned in order to improve characteristics of the semiconductor device increasingly.

While the semiconductor device 900 in FIG. 18 includes both a first intermediate material layer 951 and a second intermediate material layer 952, the first intermediate material layer 951 or the second intermediate material layer 952, may be omitted in an alternative semiconductor device.

According to the example embodiments, the intermediate material layer forming an edge-contact with the metal layer is disposed between the graphene layer and the metal layer so as to reduce the contact resistance between the graphene layer and the metal layer. Therefore, if the graphene-metal bonding structure is applied to the semiconductor device such as a transistor, the characteristics of the semiconductor device may be improved due to the reduction in the contact resistance. Also, the graphene-metal bonding structure may be applied to a device of a fine size, for example, a nano-device, as well as a large-sized device.

It should be understood that example embodiments described therein should be considered in a descriptive sense only and not for purposes of limitation. Descriptions of features or aspects within each graphene-metal bonding structure according to example embodiments (and/or methods of manufacturing thereof) should typically be considered as available for other similar features or aspects in other graphene-metal bonding structures according to example embodiments (and/or methods of manufacturing thereof). Descriptions of features or aspects within each semiconductor device according to example embodiments (and/or methods of manufacturing thereof) should typically be considered as available for other features or aspects in other semiconductor devices according to example embodiments (and/or methods of manufacturing thereof).

While some example embodiments have been particularly shown and described, it will be understood by one of ordinary skill in the art that variations in form and detail may be made therein without departing from the spirit and scope of the claims.

What is claimed is:

1. A semiconductor device comprising:
   a graphene-metal bonding structure on a substrate,
      the graphene-metal bonding structure including a graphene layer, a metal layer on the graphene layer, and an intermediate material layer between the graphene layer and the metal layer,
      the intermediate material layer forming an edge-contact with the metal layer from boundary portions of a material contained in the intermediate material layer that contact the metal layer, and
   the intermediate material layer including a carbon-based material,
   the metal layer being a first electrode,
   the graphene layer being a first graphene layer between the substrate and the first electrode, and
   the intermediate material layer being a first intermediate material layer;
   a second electrode spaced apart from the first electrode on the substrate, the first electrode and the second electrode including a metal;
   a gate insulating layer on the substrate between the first electrode and the second electrode;
   a gate electrode on the gate insulating layer;
   a second graphene layer between the substrate and the second electrode; and
   a second intermediate material layer between the second graphene layer and the second electrode, the second intermediate material layer forming an edge-contact with the second electrode from boundary portions of a material contained in the second intermediate material layer that contact the second electrode.

2. The semiconductor device of claim 1, wherein the substrate includes a semiconductor material.

3. The semiconductor device of claim 2, wherein
   the substrate includes a first region and a second region that are spaced apart from each other along a surface of the substrate,
   the first region and the second region are doped with impurities, and
   a channel is between the first region and the second region.

4. The semiconductor device of claim 1, wherein
   one of the first electrode and the second electrode is a source electrode, and
   an other of the first electrode and the second electrode is a drain electrode.

5. The semiconductor device of claim 1, wherein the first intermediate material layer and the second intermediate material layer include at least one carbon-based material.

6. The semiconductor device of claim 1, wherein each of the first and second intermediate material layers independently include at least one of a porous material having a plurality of pores, a crystalline material including a plurality of crystal grains, and a patterned graphene.

7. The semiconductor device of claim 6, wherein
   the porous material is selectively reduced graphene oxide or a plurality of carbon nanotubes (CNTs), and
   the crystalline material is nano-crystalline graphene including nano-sized crystal grains.

8. The semiconductor device of claim 1, wherein at least one of the first intermediate material layer and the second intermediate material layer is patterned.

9. The semiconductor device of claim 1, wherein at least one of the first intermediate material layer and the second intermediate material layer has a multi-layer structure in which a plurality of material layers are stacked on each other.

10. The semiconductor device of claim 9, wherein
the plurality of material layers include a material layer contacting the first electrode or the second electrode, and
the material layer contacting the first electrode or the second electrode includes at least one of a porous material having a plurality of pores, a crystalline material including a plurality of crystal grains, and patterned graphene.

11. A semiconductor device comprising:
an insulating layer on a substrate at one side of the substrate;
a graphene-metal bonding structure on the insulating layer,
the graphene-metal bonding structure including a graphene layer, a metal layer on the graphene layer, and an intermediate material layer between the graphene layer and the metal layer,
the intermediate material layer forming an edge-contact with the metal layer from boundary portions of a material contained in the intermediate material layer that contact the metal layer, and
the intermediate material layer including a carbon-based material,
the metal layer of the graphene-metal bonding structure being a first electrode on the insulating layer,
the first electrode including a metal,
the graphene layer being a first graphene layer between the insulating layer and the first electrode, the first graphene layer extending to a surface of the substrate,
the intermediate material layer being a first intermediate material layer between the first electrode and the first graphene layer;
a second electrode on the substrate at an other side of the substrate, the second electrode including a metal;
a second graphene layer between the substrate and the second electrode;
a second intermediate material layer between the second electrode and the second graphene layer, the second intermediate material layer forming an edge-contact with the second electrode from boundary portions of a material contained in the second intermediate material layer that contacts the second electrode;
a gate insulating layer on the insulating layer and the substrate, the gate insulating layer covering the first graphene layer; and
a gate electrode on the gate insulating layer.

12. The semiconductor device of claim 11, wherein the substrate includes a semiconductor material.

13. The semiconductor device of claim 12, wherein
a channel is formed on the surface of the substrate, and
the second graphene layer contacts the channel, and
one side of the first graphene layer contacts the channel.

14. The semiconductor device of claim 11, wherein
one of the first electrode and the second electrode is a source electrode, and
an other of the first electrode and the second electrode is a drain electrode.

15. The semiconductor device of claim 11, wherein the first intermediate material layer and the second intermediate material layer include a carbon-based material.

16. The semiconductor device of claim 11, wherein each of the first and second intermediate material layers independently include at least one of a porous material having a plurality of pores, a crystalline material including a plurality of crystal grains, and a patterned graphene.

17. The semiconductor device of claim 16, wherein
the porous material is selectively reduced graphene oxide or a plurality of carbon nanotubes (CNTs), and
the crystalline material is nano-crystalline graphene including nano-sized crystal grains.

18. The semiconductor device of claim 11, wherein at least one of the first intermediate material layer and the second intermediate material layer is patterned.

19. The semiconductor device of claim 11, wherein at least one of the first intermediate material layer and the second intermediate material layer has a multi-layer structure in which a plurality of material layers are stacked on each other.

* * * * *